United States Patent
Futatsuyama

(10) Patent No.: US 7,142,453 B2
(45) Date of Patent: Nov. 28, 2006

(54) SEMICONDUCTOR MEMORY DEVICE AND MEMORY CARD

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/196,460

(22) Filed: Aug. 4, 2005

(65) Prior Publication Data

US 2006/0133142 A1    Jun. 22, 2006

(30) Foreign Application Priority Data

Dec. 21, 2004  (JP) ............................ 2004-369916

(51) Int. Cl.
*G11C 16/04* (2006.01)
(52) U.S. Cl. ............................ 365/185.11; 365/185.05; 365/185.17; 365/185.23
(58) Field of Classification Search .......... 365/185.05, 365/185.11, 185.12, 185.17, 185.23, 230.03, 365/230.06
See application file for complete search history.

(56) References Cited

U.S. PATENT DOCUMENTS 5,515,327 A * 5/1996 Matsukawa et al. ........ 365/203
6,044,017 A * 3/2000 Lee et al. ............... 365/185.18
6,853,029 B1 * 2/2005 Ichige et al. ................. 257/316
6,891,757 B1 * 5/2005 Hosono et al. ........ 365/185.19

FOREIGN PATENT DOCUMENTS

JP    8-255494    10/1996
JP    11-238391    8/1999

* cited by examiner

*Primary Examiner*—Gene N. Auduong
(74) *Attorney, Agent, or Firm*—Oblon, Spivak, McClelland, Maier & Neustadt, P.C.

(57) ABSTRACT

A semiconductor memory device disclosed herein comprises: a memory cell array including memory blocks, each memory block including memory cells arranged in a matrix and the memory cell array including first select gate transistors to select one or more memory cells; a select gate line configured to input a control signal which controls continuity of the first select gate transistor to a gate of the first select gate transistor, the select gate line being shared between two adjacent memory blocks; and a row select circuit configured to select a memory block of a row designated by an input address signal, wherein the row select circuit comprises: only one transfer transistor provided between the select gate line and a non-select signal line to which a non-select signal is supplied, the non-select signal being the control signal indicating non-selection; and a select gate control circuit configured to bring the transfer transistor into conduction to supply the non-select signal to the select gate line when both the two adjacent memory blocks are not selected.

12 Claims, 20 Drawing Sheets

SEMICONDUCTOR MEMORY DEVICE AND MEMORY CARD

CROSS REFERENCE TO RELATED APPLICATION

This application claims benefit of priority under 35 U.S.C. §119 to Japanese Patent Application No. 2004-369916, filed on Dec. 21, 2004, the entire contents of which are incorporated by reference herein.

BACKGROUND OF THE INVENTION

1. Field of the Invention

The present invention relates to a semiconductor memory device and a memory card, and particularly relates to a semiconductor memory device in which a reduction in the circuit area of a row select circuit is realized and a memory card including such a semiconductor memory device.

2. Related Background Art

In a memory cell of a nonvolatile semiconductor memory device, a charge storage layer is provided between a gate electrode and a substrate with a gate insulating film therebetween. To inject charge into this charge storage layer or extract charge therefrom, it is necessary to apply a boosted voltage which is higher than a power supply voltage to the memory cell (See Japanese Patent Application Laid-open No. Hei 11-238391, for example).

A logic circuit driven by the power supply voltage requires a transistor capable of supplying a desired current, and a logic circuit driven by the boosted voltage requires a transistor having a desired withstand voltage. To fulfill both these requirements, a peripheral circuit of the nonvolatile semiconductor memory device is composed of normal transistors to which a voltage nearly equal to the power supply voltage is supplied and high withstand voltage transistors to which a voltage higher than the power supply voltage is supplied. The film thickness of a gate insulating film of the high withstand voltage transistor is thicker than that of a gate insulating film of the normal transistor.

The sizes of a source, a drain, and a gate of a memory cell are reduced as the generation of fabrication advances, and the sizes thereof of the normal transistor are also correspondingly reduced. However, in the present situation, the high withstand voltage transistor is almost unchanged since the Program voltage is not decreased. Therefore, it can be said that the circuit area of a row select circuit is determined by the size and circuit configuration of the high withstand voltage transistors. Accordingly, as the generation of fabrication advances, in order to reduce the circuit area, it becomes desirable to reduce the number of high withstand voltage transistors even if the number of normal transistors is increased.

SUMMARY OF THE INVENTION

In order to accomplish the aforementioned and other objects, according to one aspect of the present invention, semiconductor memory device, comprises:

a memory cell array including a plurality of memory blocks, each memory block including a plurality of memory cells arranged in a matrix and the memory cell array including a plurality of first select gate transistors to select one or more memory cells;

a select gate line configured to input a control signal which controls continuity of the first select gate transistor to a gate of the first select gate transistor, the select gate line being shared between two adjacent memory blocks; and a row select circuit configured to select a memory block of a row designated by an input address signal, wherein the row select circuit comprises:

only one transfer transistor provided between the select gate line and a non-select signal line to which a non-select signal is supplied, the non-select signal being the control signal indicating non-selection; and a select gate control circuit configured to bring the transfer transistor into conduction to supply the non-select signal to the select gate line when both the two adjacent memory blocks are not selected.

According to another aspect of the present invention, a memory card includes a semiconductor memory device, wherein the semiconductor memory device comprises:

a memory cell array including a plurality of memory blocks, each memory block including a plurality of memory cells arranged in a matrix and the memory cell array including a plurality of first select gate transistors to select one or more memory cells;

a select gate line configured to input a control signal which controls continuity of the first select gate transistor to a gate of the first select gate transistor, the select gate line being shared between two adjacent memory blocks; and a row select circuit configured to select a memory block of a row designated by an input address signal, and the row select circuit comprises:

only one transfer transistor provided between the select gate line and a non-select signal line to which a non-select signal is supplied, the non-select signal being the control signal indicating non-selection; and a select gate control circuit configured to bring the transfer transistor into conduction to supply the non-select signal to the select gate line when both the two adjacent memory blocks are not selected.

DETAILED DESCRIPTION OF THE EMBODIMENTS

[First Embodiment]

In this embodiment, by reducing the number of high withstand voltage transistors to transfer voltage to a select gate transistor for non-selected memory cells in a row select circuit of a semiconductor memory device including select gate transistors to select memory cells in a memory cell array, a reduction in the circuit area of the row select circuit is realized. Further details will be given below.

Figure 1:
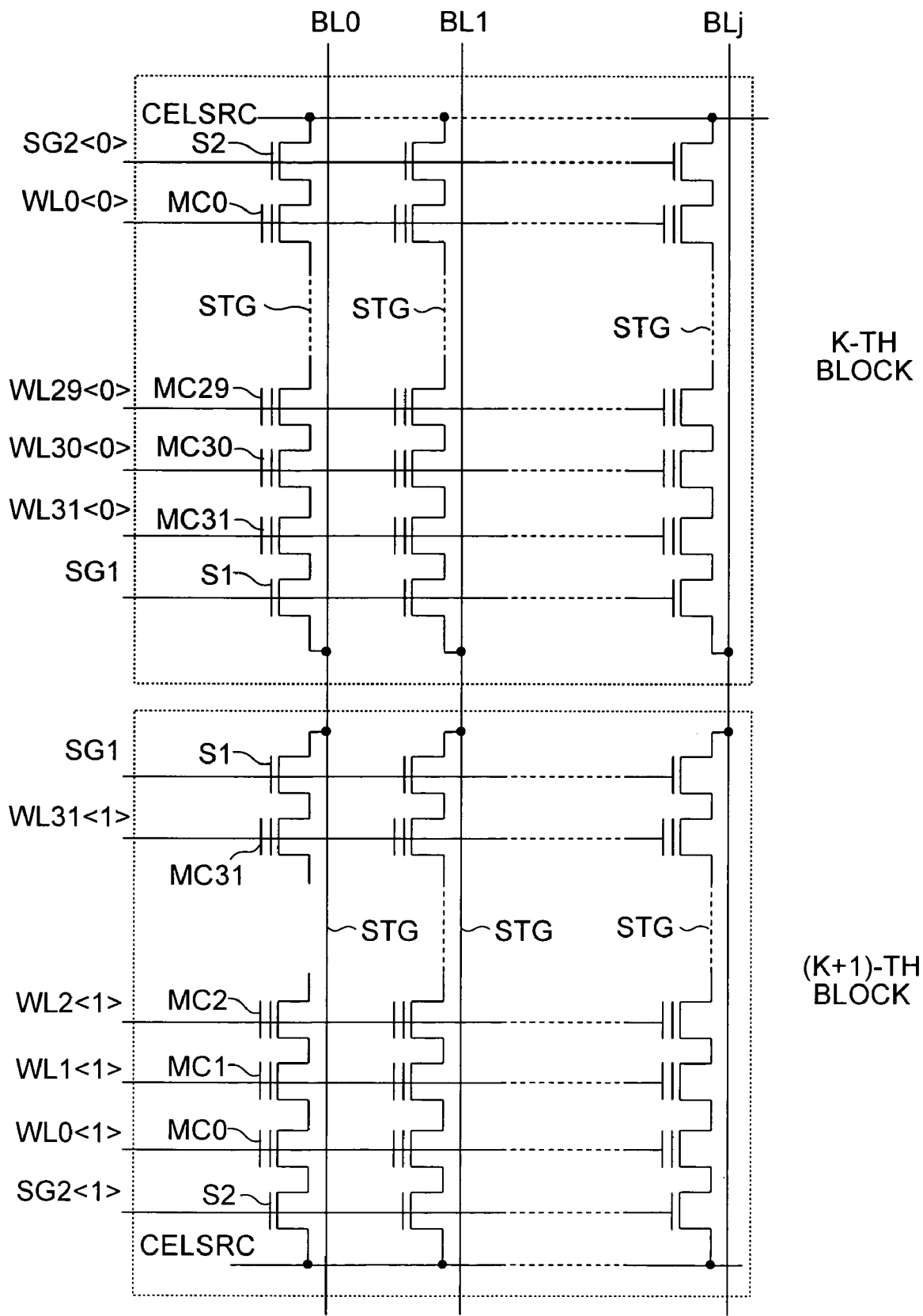
FIG. 1 is a diagram showing a portion of the configuration of a memory cell array in a nonvolatile semiconductor memory device according to a first embodiment.

FIG. 1 is a circuit diagram showing a portion of a memory cell array in a NAND-type nonvolatile semiconductor memory device as an example of a semiconductor memory device according to this embodiment. As shown in FIG. 1, one NAND cell string STG in the NAND-type nonvolatile semiconductor memory device includes two select transistors S1 and S2 and plural memory cells MC0 to MC31 connected in series between these two select transistors S1 and S2.

A gate of the select transistor S1 is connected to a select gate line SG1, and a gate of the select transistor S2 is connected to a select gate line SG2<0>. Control gates of the memory cells MC0 to MC31 are connected to word lines WL0<0> to WL31<0>, respectively. The memory cells MC0 to MC31 are connected in series by sharing source/drain to form one current path. In this embodiment, the number of word lines is 32, but the number is arbitrary.

Respective one ends of current paths of the select transistors S2 are connected to a source line CELSRC, and respective one ends of current paths of the select transistors S1 are connected to bit lines BL0 to BLj. The control gates of the memory cells MC0 to MC31 are connected in common in a row direction of the memory cell array, and gate electrodes of the select transistors S1 and S2 are also connected in common in the row direction of the memory cell array.

A set of NAND cell strings STG to which the word lines WL0<0> to WL31<0> and the select gate lines SG1 and SG2 are connected in common compose one erase unit, and in this embodiment, this erase unit is defined as a memory block. This memory block is shown here as a K-th block.

Also as concerns a (K+1)-th block adjacent to the K-th block, the structure of the NAND cell string STG is the same. Note that the K-th block and the (K+1)-th block share the select gate line SG1.

In actuality, a plurality of pairs of memory blocks shown in FIG. 1 compose one memory cell array. Note that in this embodiment, two adjacent memory cell blocks share the select gate line SG1.

Figure 2:
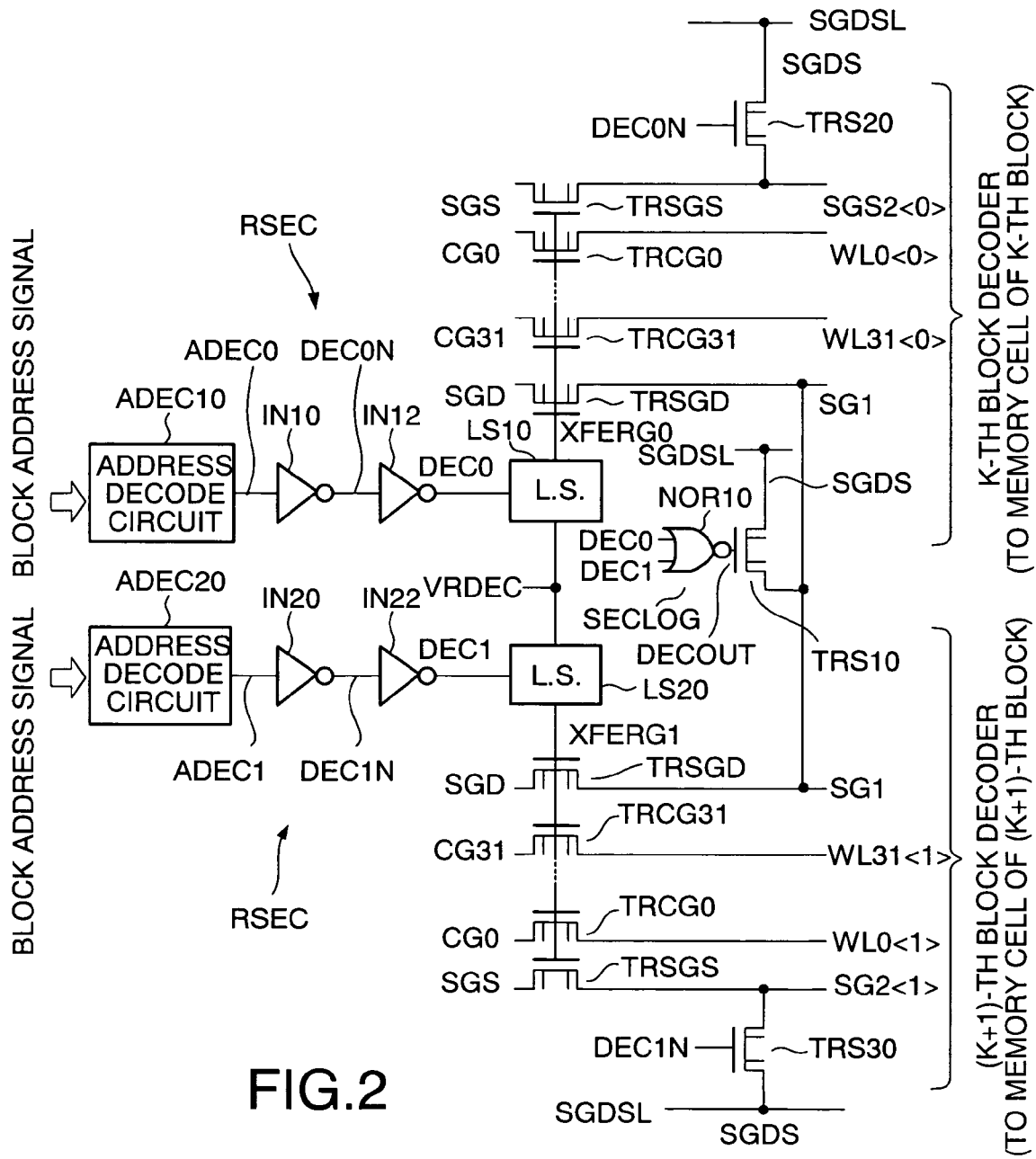
FIG. 2 is a diagram showing an example of the configuration of a row select circuit according to the first embodiment.

FIG. 2 is a circuit block diagram showing the circuit configuration of a row select circuit RSEC for the nonvolatile semiconductor memory device in FIG. 1. One row select circuit RSEC is provided for each memory block. In FIG. 2, the row select circuits RSEC of the K-th block and the (K+1)-th block are shown.

If attention is paid to the row select circuit RSEC of the K-th block, the row select circuit RSEC includes an address decode circuit ADEC10, inverters IN10 and IN12, a level shifter LS10, a transfer transistor TRSGS, a transfer transistor TRSGD, and transfer transistors TRCG0 to TRCG31.

A block address signal is input to the address decode circuit ADEC10, and a block select signal ADEC0 is output therefrom. The block select signal ADEC0 is input to the inverter IN10, and an inversion signal DEC0N obtained by inverting the block select signal ADEC0 is output therefrom. This inversion signal DEC0N is input to the inverter IN12, and a signal DEC0 obtained by waveform-shaping the block select signal ADEC0 is output therefrom. Incidentally, the block address signal may be a signal showing a block address itself or a signal in which the block address is predecoded.

In this embodiment, the block select signal ADEC0 goes high in a block corresponding to a selected block, and goes low in a block corresponding to a non-selected block. Hence, the inversion signal DEC0N goes low in the block corresponding to the selected block, and goes high in the block corresponding to the non-selected block.

The signal DEC0 obtained by waveform-shaping this block select signal ADEC0 is input to the level shifter LS10. A boosted voltage VRDEC is also supplied to the level shifter LS10. In response to the input signal DEC0, this level shifter 10 controls whether or not to supply the boosted voltage VRDEC to a gate line XFERG0 which connects gates of the transfer transistor TRSGS, the transfer transistor TRSGD, and the transfer transistors TRCG0 to TRCG31 in common. Namely, the boosted voltage VRDEC or 0 V is supplied to the gate line XFERG0 from the level shifter 10 in response to the signal DEC0.

The transfer transistor TRSGD is a transistor to transfer a select gate signal SGD to the select gate line SG1. The transfer transistor TRSGS is a transistor to transfer a gate signal SGS to the select gate line SG2<0>. The transfer transistors TRCG0 to TRCG31 are transistors to transfer word line control signals CG0 to CG31 to the word lines WL<0> to WL<31>.

The row select circuit RSEC according to this embodiment further includes transfer transistors TRS10 and TRS20 and a select gate control circuit SECLOG. The transfer transistor TRS10 is a transistor to transfer a non-select signal SGDS supplied from the non-select signal line SDGSL to the select gate line SG1. An output of the select gate control circuit SECLOG is input to the gate of the transfer transistor TR10.

The transfer transistor TRS20 is a transistor to transfer the non-select signal SGDS supplied from the non-select signal line SDGSL to the select gate line SG2<0>. The inversion signal DEC0N is input to the gate of the transfer transistor TRS20.

The configuration of the row select circuit RSEC of the (K+1)-th block is basically the same as that of the row select circuit RSEC of the K-th block. Namely, the row select circuit RSEC of the (K+1)-th block includes an address decode circuit ADEC20, an inverter IN20, an inverter IN22, a level shifter LS20, transfer transistors TRSGS, TRSGD, and TRCG0 to TRCG31, and a transfer transistor TRS30.

Also in the row select circuit RSEC of the (K+1)-th block, as in the row select circuit RSEC of the K-th block, the block address signal is input to the address decode circuit ADEC20, and the block select signal ADEC1 is output therefrom. The block select signal ADEC1 is input to the inverter IN20, and an inversion signal DEC1N obtained by inverting the block select signal ADEC1 is output therefrom. This inversion signal DEC1N is input to the inverter IN22, and the signal DEC1 obtained by waveform-shaping the block select signal ADEC1 is output therefrom. This signal DEC1 obtained by waveform-shaping the block select signal ADEC1 is input to the level shifter LS20. The inversion signal DEC1N output from the inverter IN20 is input to the transfer transistor TRS30.

Note that in this embodiment, the row select circuit RSEC of the K-th block and the row select circuit RSEC of the (K+1)-th block share the transfer transistor TRS10 and the select gate control circuit SECLOG.

More specifically, the select gate control circuit SECLOG is composed of a two-input NOR circuit NOR10. The signal DEC0 obtained by waveform-shaping the block select signal ADEC0 and the signal DEC1 obtained by waveform-shaping the block select signal ADEC1 are input to this NOR circuit NOR10. The output signal DECOUT of this NOR circuit NOR10 is input to the gate of the transfer transistor TRS10.

Therefore, the transfer transistor TRS10 is brought into conduction only when both the K-th block and the (K+1)-th block are non-selected blocks, and the non-select signal SGDS is supplied to the select gate line SG1 from the non-select signal line SDGSL. When the non-select signal SGDS is supplied to the select gate line SG1, the select gate transistor S1 is brought out of conduction.

Incidentally, in this embodiment, the aforementioned transfer transistor TRSGS, transfer transistor TRSGD, transfer transistors TRCG0 to TRCG31, and transfer transistors TRS10, TRS20, and TRS30 are each composed of a high withstand voltage transistor. In contrast, the NOR circuit NOR10 is composed of normal transistors. Here, the normal transistor means a transistor whose gate insulating film thickness is thinner than that of the high withstand voltage transistor.

Figure 3:
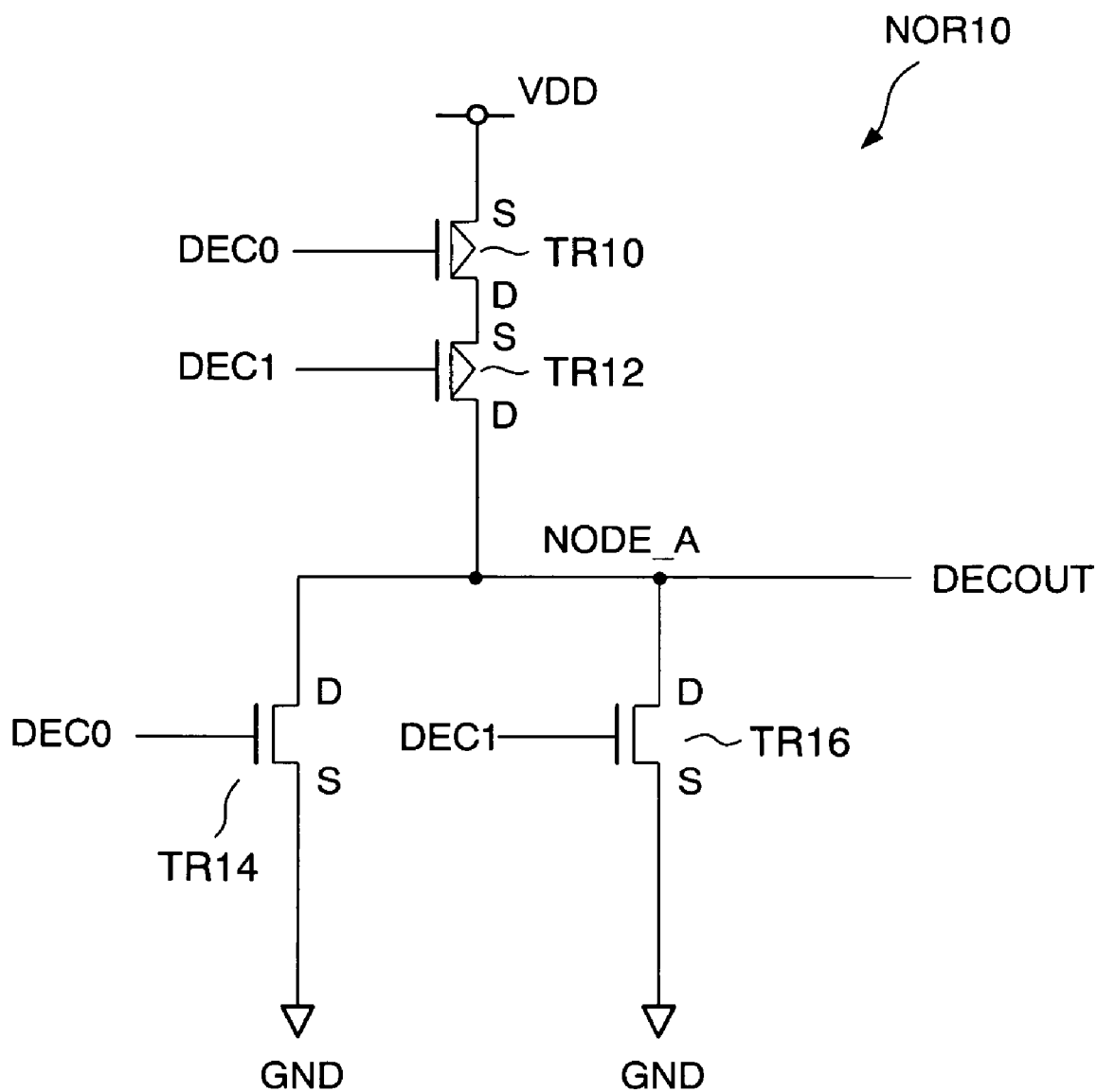
FIG. 3 is a diagram showing an example of the circuit configuration of a select gate control circuit in FIG. 2.

FIG. 3 is a circuit diagram showing an example of the configuration of the NOR circuit NOR10 according to this embodiment. As shown in FIG. 3, in this embodiment, the NOR circuit NOR10 includes P-type transistors TR10 and TR12, and N-type transistors TR14 and TR16. These transistors TR10 to TR16 are not high withstand voltage transistors but normal transistors.

The transistor TR10 and the transistor TR12 are connected in series between a power supply voltage VDD and a node NODE_A. The signal DEC0 is input to a gate of the transistor TR10, and the signal DEC1 is input to a gate of the transistor TR12.

The transistor TR14 and the transistor TR16 are connected in parallel between the node NODE_A and a ground GND respectively. The signal DEC0 is input to a gate of the transistor TR14, and the signal DEC1 is input to a gate of the transistor TR16. The aforementioned output signal DECOUT is output from the node NODE_A.

Figure 4:
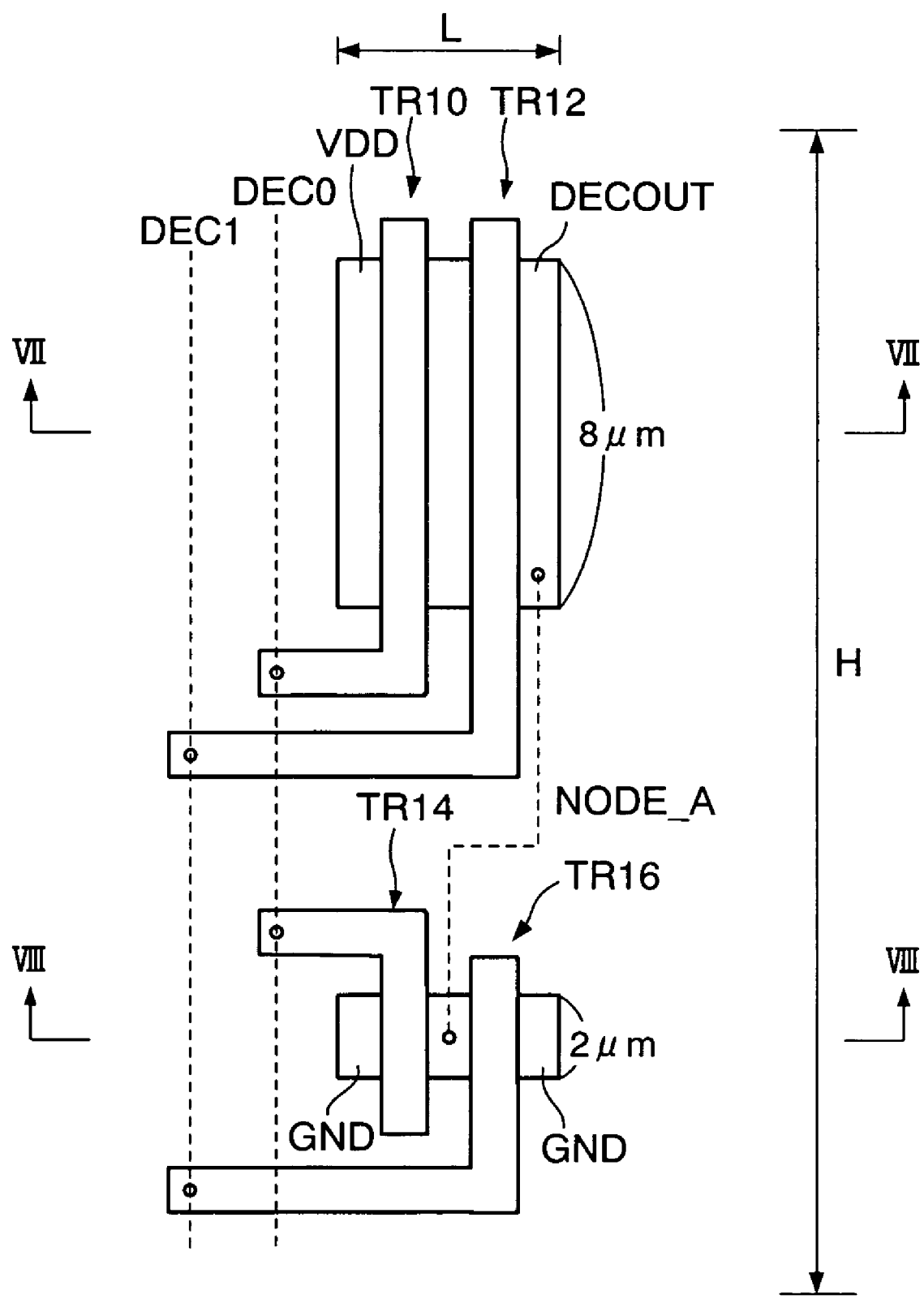
FIG. 4 is a diagram showing an example of the plane layout of the select gate control circuit in FIG. 3.

FIG. 4 is a diagram showing the plane layout on a semiconductor substrate of the NOR circuit NOR10 shown in FIG. 3. In the example in FIG. 4, the transistor TR10 and the transistor TR12 are formed with a gate width of 8 μm, and with a total of a gate length and lengths of source/drain regions being L. Moreover, the transistor TR10 and the transistor TR12 are formed to share the source/drain regions.

The transistor TR14 and the transistor TR16 are formed with a gate width of 2 μm, and with a total of lengths of source/drain regions being around L. A drain of the transistor TR12 and drains of the transistors TR14 and TR16 are connected in common by a wiring layer not shown to form the aforementioned node NODE_A.

These four transistors TR10 to TR16 fall within a height H.

Figures 5A, 5B:
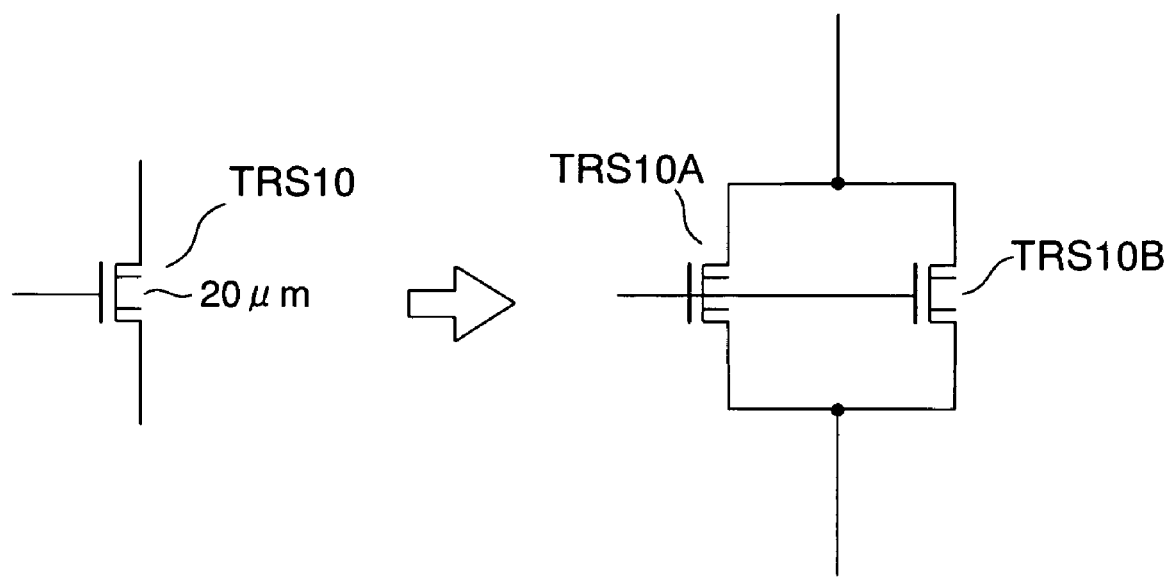
FIG. 5A is a diagram showing a high withstand voltage transistor.
FIG. 5B is a diagram showing an equivalent circuit of FIG. 5A.

Incidentally, in this embodiment, the high withstand voltage transistor TRS10 shown in FIG. 5A is composed of an equivalent circuit including two transistors TRS10A and TRS10B such as shown in FIG. 5B.

Figure 6:
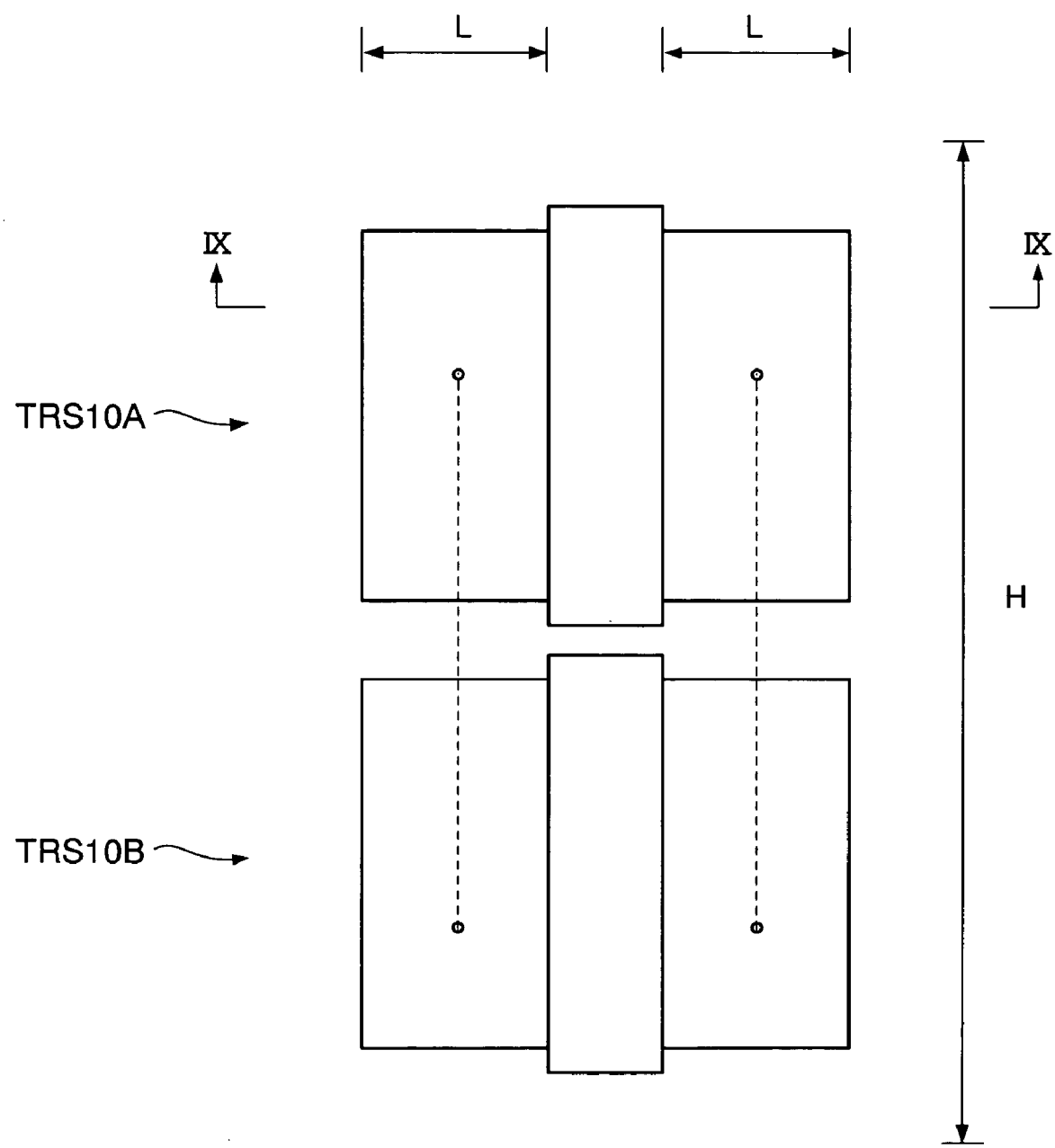
FIG. 6 is a diagram showing an example of the plane layout of the high withstand voltage transistor in FIG. 5B.

FIG. 6 is a diagram showing the plane layout on the semiconductor substrate of the equivalent circuit including the transistors TRS10A and TRS10B. As shown in FIG. 6, a source of the transistor TRS10A and a source of the transistor TRS10B are connected by a wiring layer not shown, and a drain of the transistor TRS10A and a drain of the transistor TRS10B are connected by a wiring layer not shown. A length of only the source of each of the transistors TRS10A and TRS10B is around L, and a length of only the drain thereof is also around L. It is noted, however, that a total of heights of the two transistors TRS10A and TRS10B falls within the height H.

Figure 7:
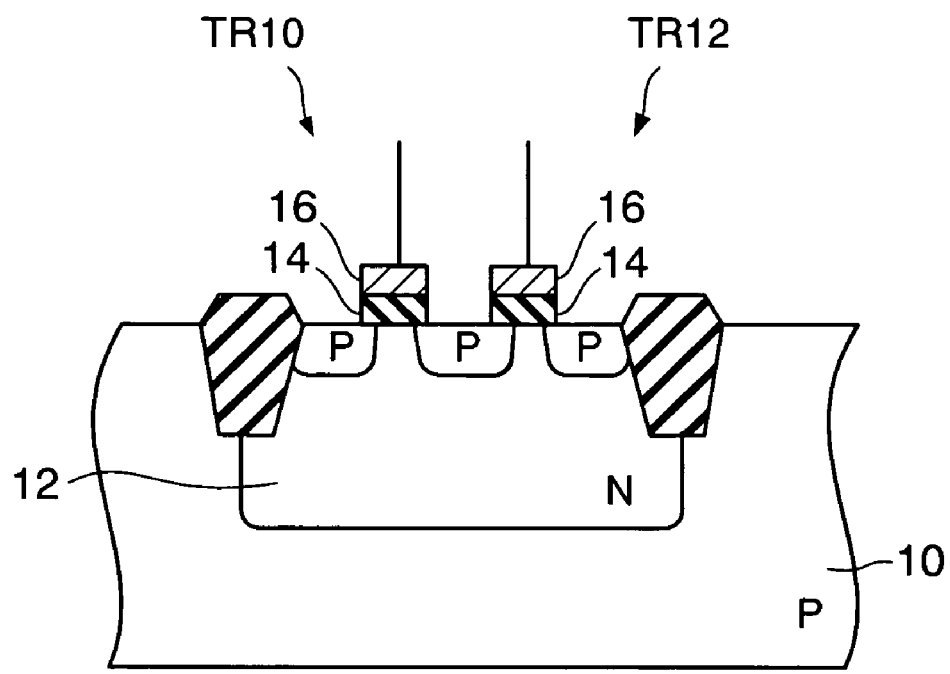
FIG. 7 is a sectional view taken along the line VII—VII in FIG. 4.
Figure 8:
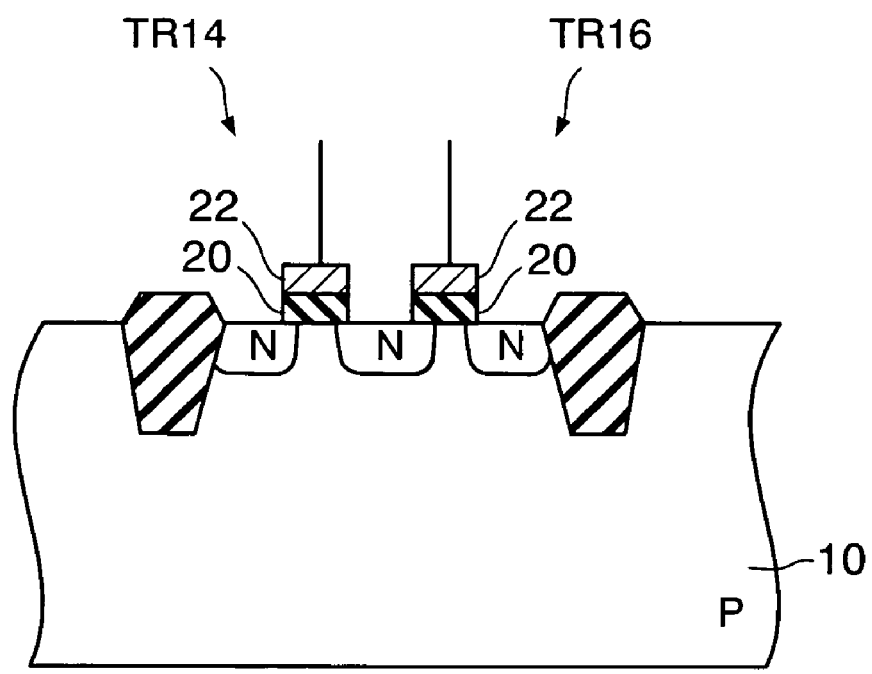
FIG. 8 is a sectional view taken along the line VIII—VIII in FIG. 4.

FIG. 7 is a sectional view taken along the line VII—VII of the P-type transistors TR10 and TR12 in FIG. 4, and FIG. 8 is a sectional view taken along the line VIII—VIII of the N-type transistors TR14 and TR16 in FIG. 4.

As shown in FIG. 7, in this embodiment, an N-type well 12 is formed on the surface side of a P-type semiconductor substrate 10, and the P-type transistors TR10 and TR12 are formed on the surface side of this well 12. Namely, gate insulating films 14 are formed on the well 12 between P-type source/drain, and gate electrodes 16 are respectively formed on the gate insulating films 14.

On the other hand, as shown in FIG. 8, the N-type transistors TR14 and the TR16 are formed on the surface side of the P-type semiconductor substrate 10. Namely, gate insulating films 20 are formed on the semiconductor substrate 10 between N-type source/drain, and gate electrodes 22 are respectively formed on the gate insulating films 20.

Figure 9:
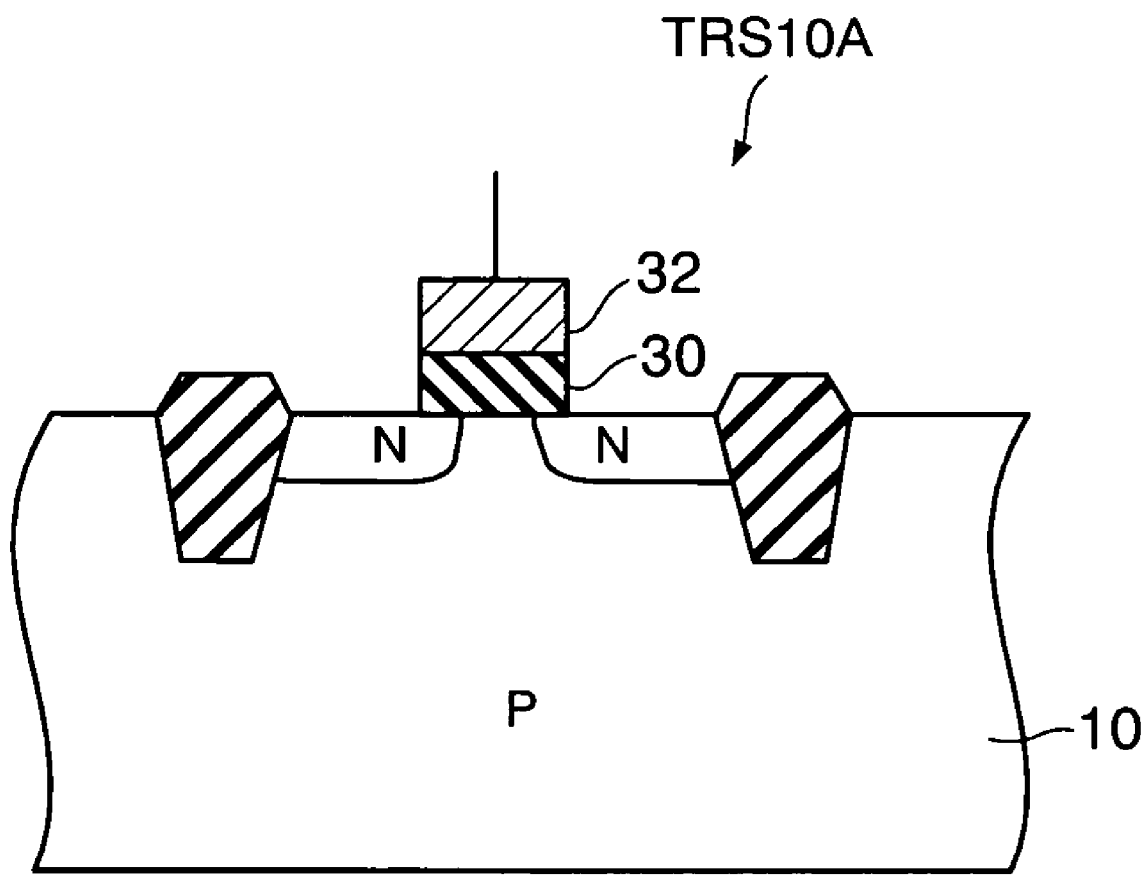
FIG. 9 is a sectional view taken along the line IX—IX in FIG. 6.

FIG. 9 is a sectional view taken along the line IX—IX of the N-type transistor TRS10A in FIG. 6. As shown in FIG. 9, the N-type transistor TRS10A is formed on the surface side of the P-type semiconductor substrate 10. Namely, a gate insulating film 30 is formed on the semiconductor substrate 10 between N-type source/drain, and a gate electrode 32 is formed on the gate insulating film 30. Note that the transistor TRS10B has the same structure as in FIG. 9. This structure is explained with the high withstand voltage transistor TRS10 as an example, but the structures of the other high withstand voltage transistors provided in the nonvolatile semiconductor memory device of this embodiment are also the same as this structure.

As can be seen from a comparison between FIG. 9, and FIG. 7 and FIG. 8, the film thickness of the gate insulating film 30 of the high withstand voltage transistor is thicker than those of the gate insulating films 14 and 20 of the normal transistors.

As described above, according to the nonvolatile semiconductor memory device of this embodiment, only one transistor is provided between the non-select signal line SGDSL to supply the non-select signal SGDS and the select gate line SG1, so that a reduction in the layout area of the row select circuit RSEC can be realized. Namely, it has hitherto been necessary to connect two high withstand voltage transistors in series between the non-select signal line SGDSL to supply the non-select signal SGDS and the select gate line SG1, but in this embodiment, only one high withstand voltage transistor is provided. As is evident from a comparison between FIG. 4 and FIG. 6, the layout area of one high withstand voltage transistor is larger than the layout area of the NOR circuit NOR10 composed of four normal transistors. Accordingly, by reducing the number of high withstand voltage transistors, the layout area of the row select circuit RSEC can be reduced.

Incidentally, although the signal DEC0 and the signal DEC1 are input to the NOR circuit NOR10 in this embodiment, the block select signals ADEC0 and ADEC1 may be input instead.

[Second Embodiment]

In the aforementioned first embodiment, the select gate control circuit SECLOG is composed of the NOR circuit NOR10, but in the second embodiment, the select gate control circuit SECLOG is composed of an AND circuit including a NAND circuit and an inverter.

Figure 10:
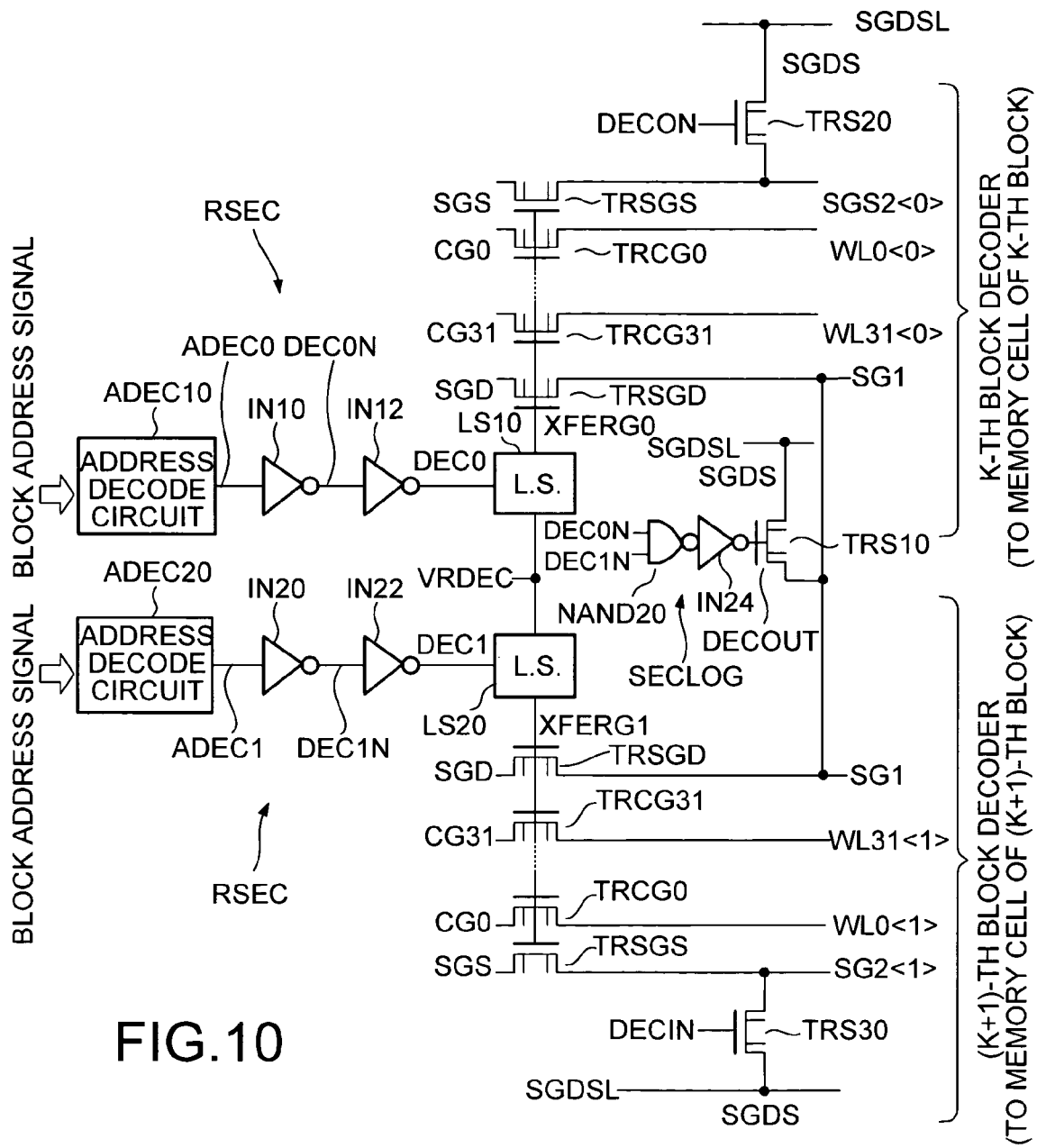
FIG. 10 is a diagram showing an example of the configuration of a row select circuit according to a second embodiment.

FIG. 10 is a diagram showing the circuit configuration of the row select circuit RSEC according to this embodiment. One row select circuit RSEC is provided for each block. In FIG. 10, the row select circuits RSEC of the K-th block and the (K+1)-th block are shown.

In this embodiment, the select gate control circuit SECLOG in the row select circuit RSEC includes a NAND circuit NAND20 and an inverter IN24. In other words, in this embodiment, the select gate control circuit SECLOG is composed of an AND circuit.

The inversion signal DEC0N and the inversion signal DEC1N are input to the NAND circuit NAND20. An output of this NAND circuit NAND20 is input to the inverter IN24, and the output signal DECOUT is output from the inverter IN24. This output signal DECOUT is input to the gate of the transfer transistor TRS10. The other portions are the same as those in the aforementioned first embodiment, and hence a detailed explanation thereof is omitted.

Figure 11:
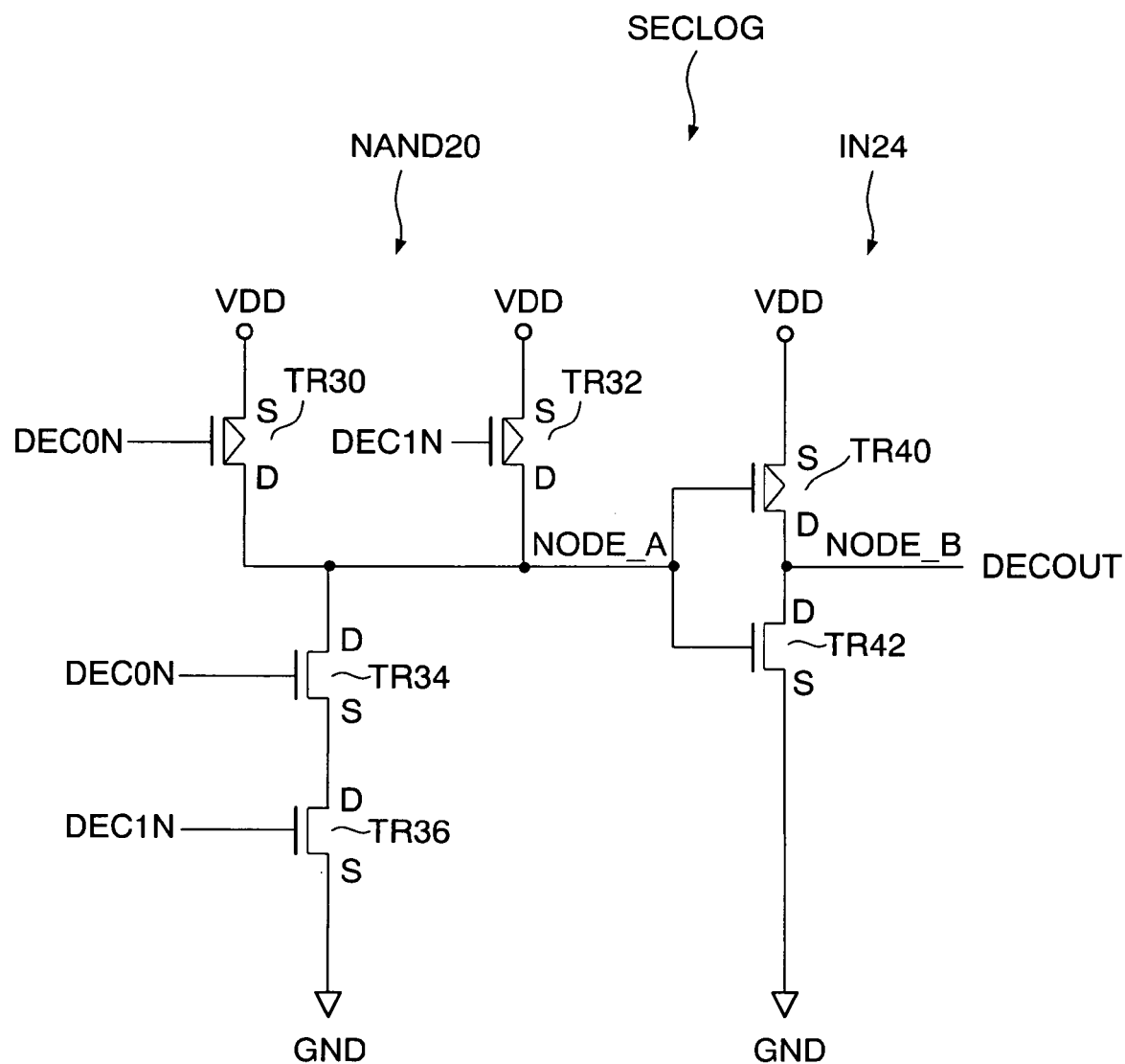
FIG. 11 is a diagram showing an example of the circuit configuration of a select gate control circuit in FIG. 10.

FIG. 11 is a circuit block diagram showing an example of the circuit configuration of the select gate control circuit SECLOG according to this embodiment. As shown in FIG. 11, the select gate control circuit SECLOG includes P-type transistors TR30 and TR32, N-type transistors TR34 and TR36, a P-type transistor TR40, and an N-type transistor T42. These transistors TR30 to TR36, TR40, and TR42 are not high withstand voltage transistors but normal transistors.

More specifically, as shown in FIG. 11, the transistor TR30 and the transistor TR32 are connected in parallel between the power supply voltage VDD and the node NODE_A. The inversion signal DEC0N is input to a gate of the transistor TR30, and the inversion signal DEC1N is input to a gate of the transistor TR32.

The transistor TR34 and the transistor TR36 are connected in series between the node NODE_A and the ground GND. The inversion signal DEC0N is input to a gate of the transistor TR34, and the inversion signal DEC1N is input to a gate of the transistor TR36.

The transistor TR40 and the transistor TR42 are connected in series between the power supply voltage VDD and the ground GND. Both a gate of the transistor TR40 and a gate of the transistor TR42 are connected to the node NODE_A respectively. The output signal DECOUT is output from a node NODE_B between the transistor TR40 and the transistor TR42.

As can be seen from this connection relationship, the NAND circuit NAND20 is composed of the transistors TR30 to TR36, and the inverter IN24 is composed of the transistors TR40 and TR42.

Figure 12:
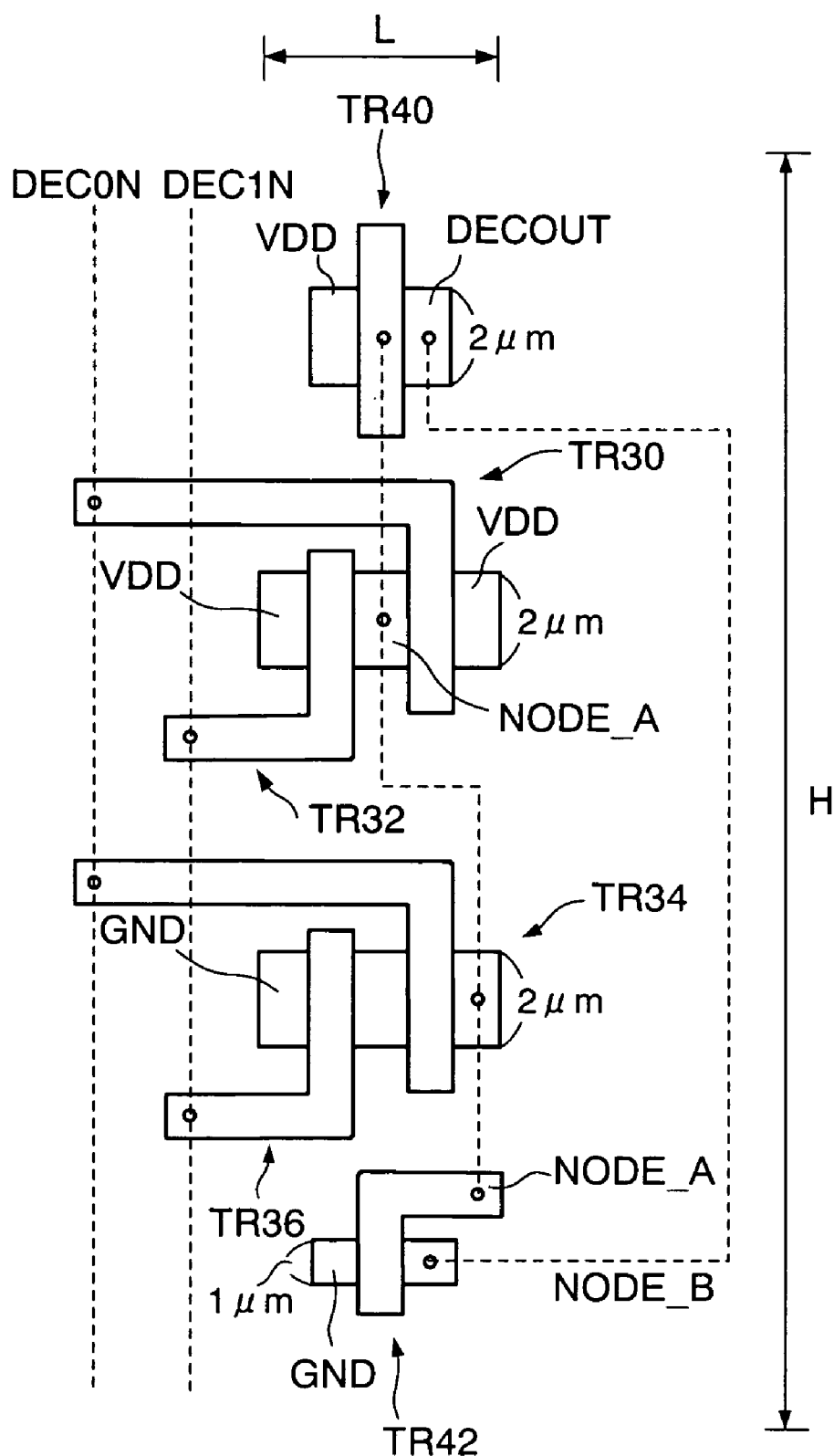
FIG. 12 is a diagram showing an example of the plane layout of the select gate control circuit in FIG. 11.

FIG. 12 is a diagram showing the plane layout on the semiconductor substrate of the NAND circuit NAND20 and the inverter IN24 shown in FIG. 11. As shown in FIG. 12, also in this embodiment, all the transistors composing the select gate control circuit SECLOG fall within the height H and the length L.

More specifically, in the example in FIG. 12, the gate width of the transistor TR40 is 2 μm, the gate widths of the transistors TR30 and TR32 are 2 μm, the gate widths of the transistors TR34 and TR36 are 2 μm, and the gate width of the transistor TR42 is 1 μm.

A drain of the transistor TR40 and a drain of the transistor TR42 are connected by a wiring layer not shown (node NODE_B). A gate of the transistor TR40, a drain of the transistor TR30, a drain of the transistor TR32, a drain of the transistor TR34, and a gate of the transistor TR42 are connected by a wiring layer not shown (node $NODE_{13}$ A).

The inversion signal DEC0N is input to a gate of the transistor TR30 and a gate of the transistor TR34 from a wiring layer not shown. The inversion signal DEC1N is input to gates of the transistor 32 and the transistor 36 from a wiring layer not shown.

As described above, also according to the nonvolatile semiconductor memory device of this embodiment, only one transistor is provided between the non-select signal line SGDSL to supply the non-select signal SGDS and the select gate line SG1, so that a reduction in the layout area of the row select circuit RSEC can be realized. Namely, it has hitherto been necessary to connect two high withstand voltage transistors in series between the non-select signal line SGDSL to supply the non-select signal SGDS and the select gate line SG1, but in this embodiment, only one high withstand voltage transistor is provided. As is evident from a comparison between FIG. 12 and FIG. 6, the layout area of one high withstand voltage transistor is larger than the layout area of the select gate control circuit SECLOG composed of six normal transistors. Accordingly, by reducing the number of high withstand voltage transistors, the layout area of the row select circuit RSEC can be reduced.

[Third Embodiment]

In the third embodiment, by modifying the aforementioned first embodiment and second embodiment, the present invention is applied to a three-transistor NAND-type nonvolatile semiconductor memory device.

Figure 13:
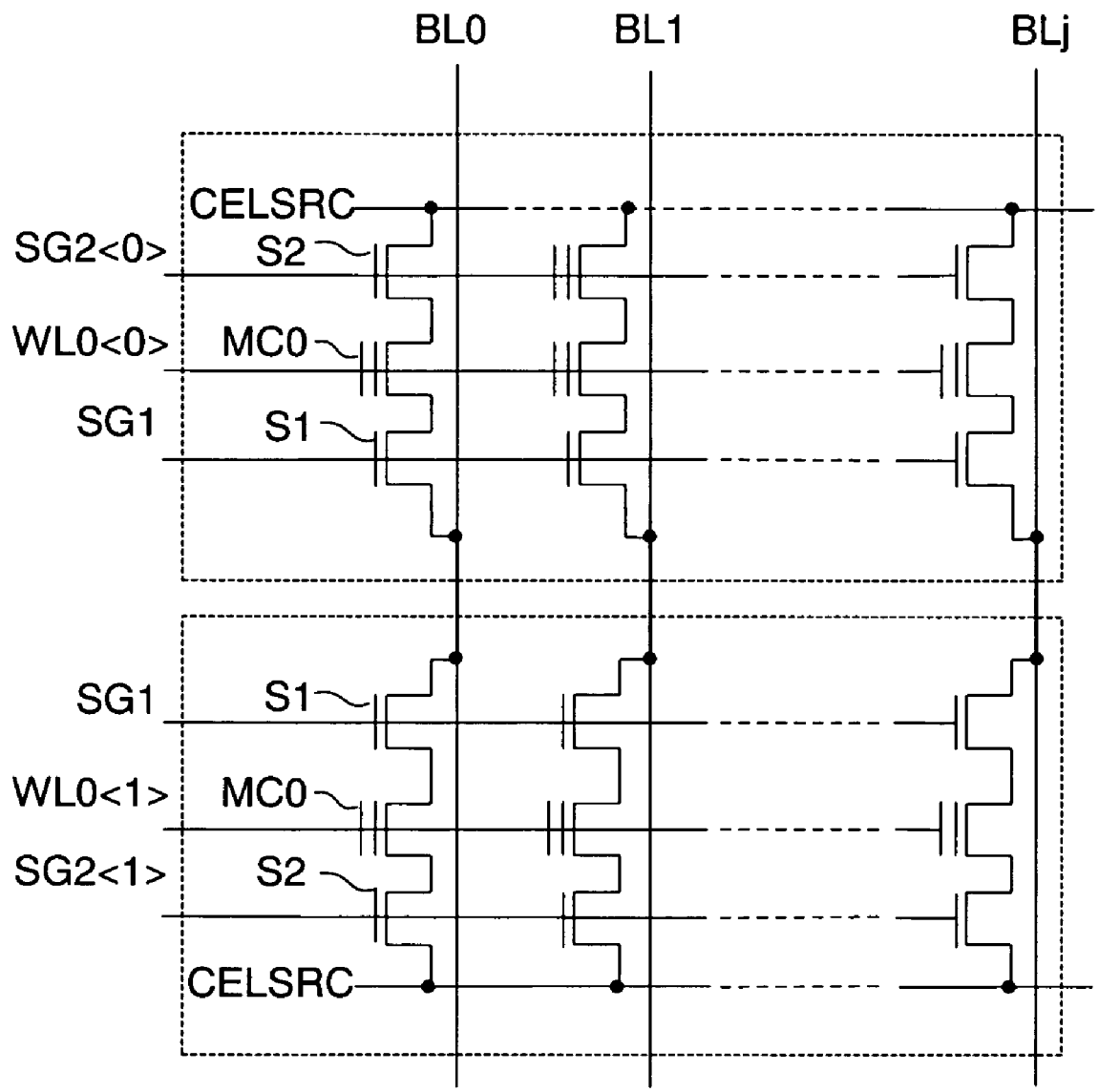
FIG. 13 is a diagram showing a portion of the configuration of a memory cell array in a nonvolatile semiconductor memory device according to a third embodiment.

FIG. 13 is a circuit diagram showing a portion of a memory cell array in a nonvolatile semiconductor memory device according to this embodiment. As shown in FIG. 13, the NAND cell string STG in this embodiment includes two select transistors S1 and S2 and one memory cell MC0 connected in series between these two select transistors S1 and S2. Namely, in the aforementioned first embodiment and second embodiment, plural memory cells are provided in one NAND cell string, but in this embodiment, only one memory cell is provided. The other points are the same as in the aforementioned first embodiment and second embodiment.

Figure 14:
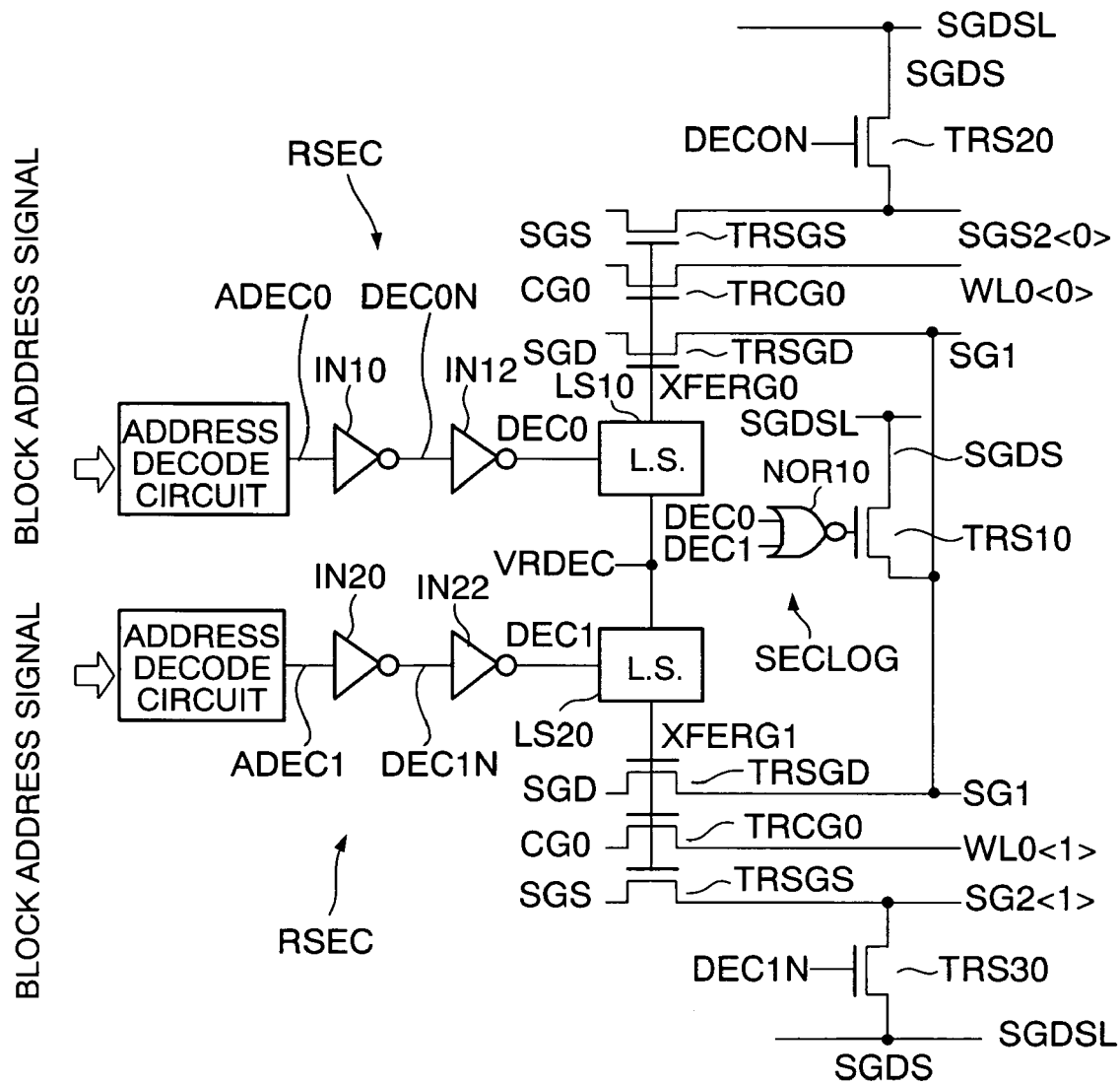
FIG. 14 is a diagram showing an example of the configuration of a row select circuit according to the third embodiment.

FIG. 14 is a diagram showing the row select circuit RSEC according to the third embodiment obtained by making a modification to the aforementioned first embodiment, and corresponds to FIG. 2 in the second embodiment.

As shown in FIG. 14, in this embodiment, only one transfer transistor TRCG0 to transfer the word line control signal CG0 to the word line WL<0> is provided. The other configuration is the same as that in FIG. 2.

Figure 15:
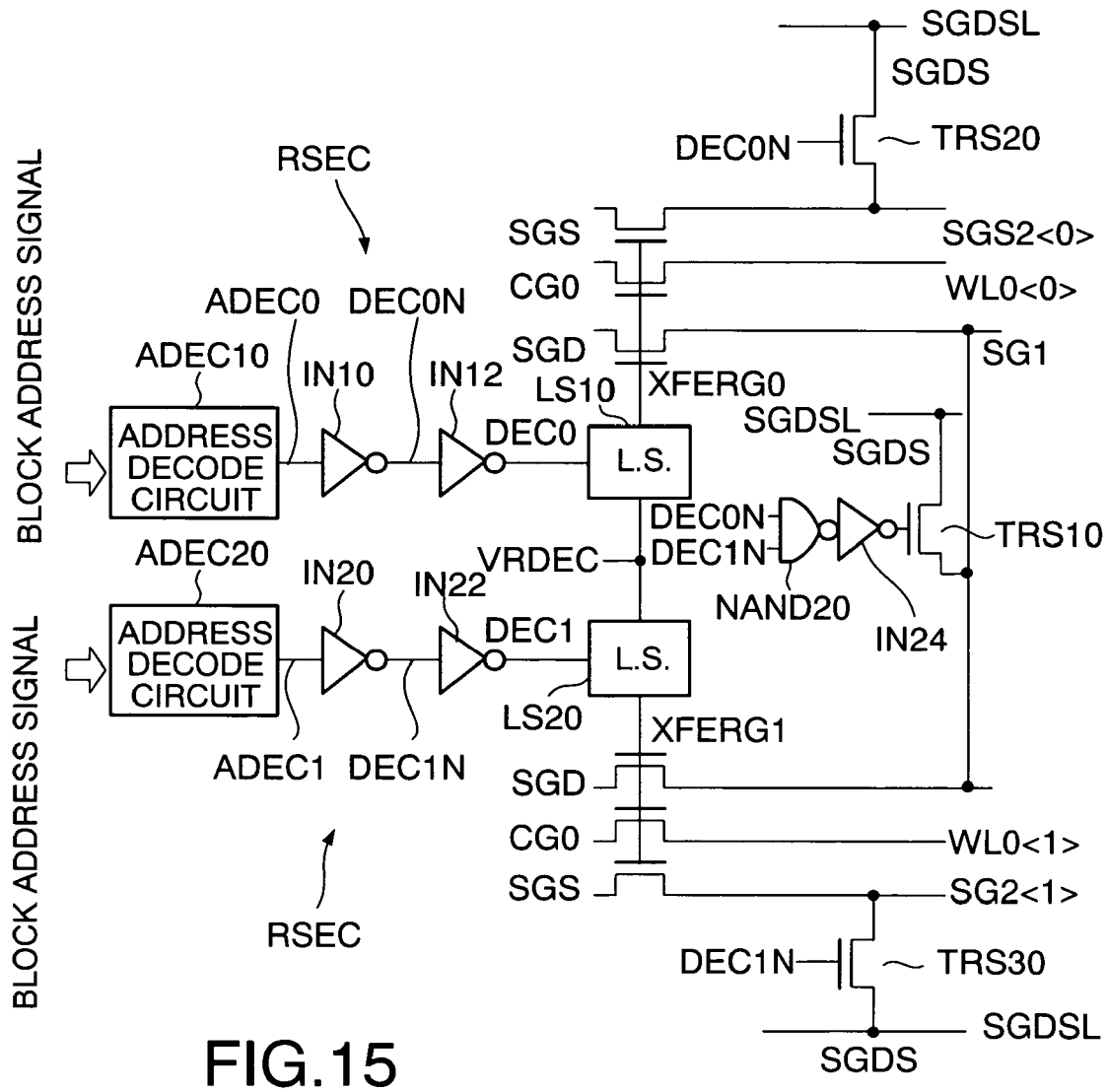
FIG. 15 is a diagram showing another example of the configuration of the row select circuit according to the third embodiment.

FIG. 15 is a diagram showing the row select circuit RSEC according to the third embodiment obtained by making a modification to the aforementioned second embodiment, and corresponds to FIG. 10 in the second embodiment.

As shown in FIG. 15, in this embodiment, only one transfer transistor TRCG0 to transfer the word line control signal CG0 to the word line WL<0> is provided. The other configuration is the same as that in FIG. 10.

As described above, the present invention is also applicable to the three-transistor NAND-type nonvolatile semiconductor memory device.

[Fourth Embodiment]

The layout of a circuit (the transfer transistors TRS10, TRS20, TRS30, TRSGS, and TRSGD) which drives the select gate lines in the nonvolatile semiconductor memory device of the aforementioned first embodiment to third embodiment will be studied in the fourth embodiment.

Figure 16:
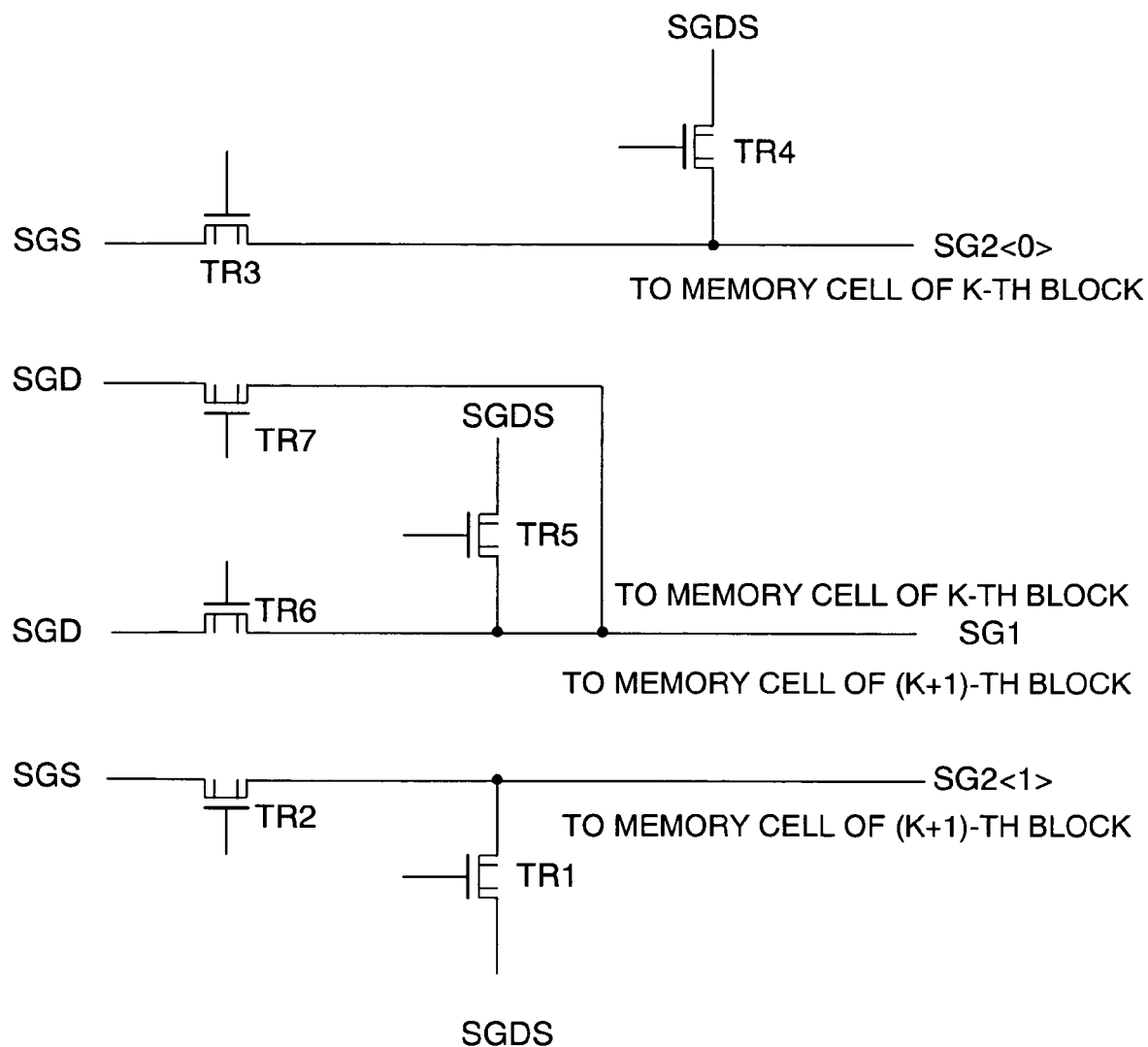
FIG. 16 is a diagram showing the connection relationship among high withstand voltage transistors in a peripheral circuit of the nonvolatile semiconductor memory device according to the first embodiment to the third embodiment (a fourth embodiment)

FIG. 16 is a circuit diagram showing the connection relationship among high withstand voltage transistors in a peripheral circuit in the nonvolatile semiconductor memory device of the aforementioned first embodiment to third embodiment. FIG. 16 shows a circuit diagram of a peripheral circuit for two memory blocks.

Figure 17:
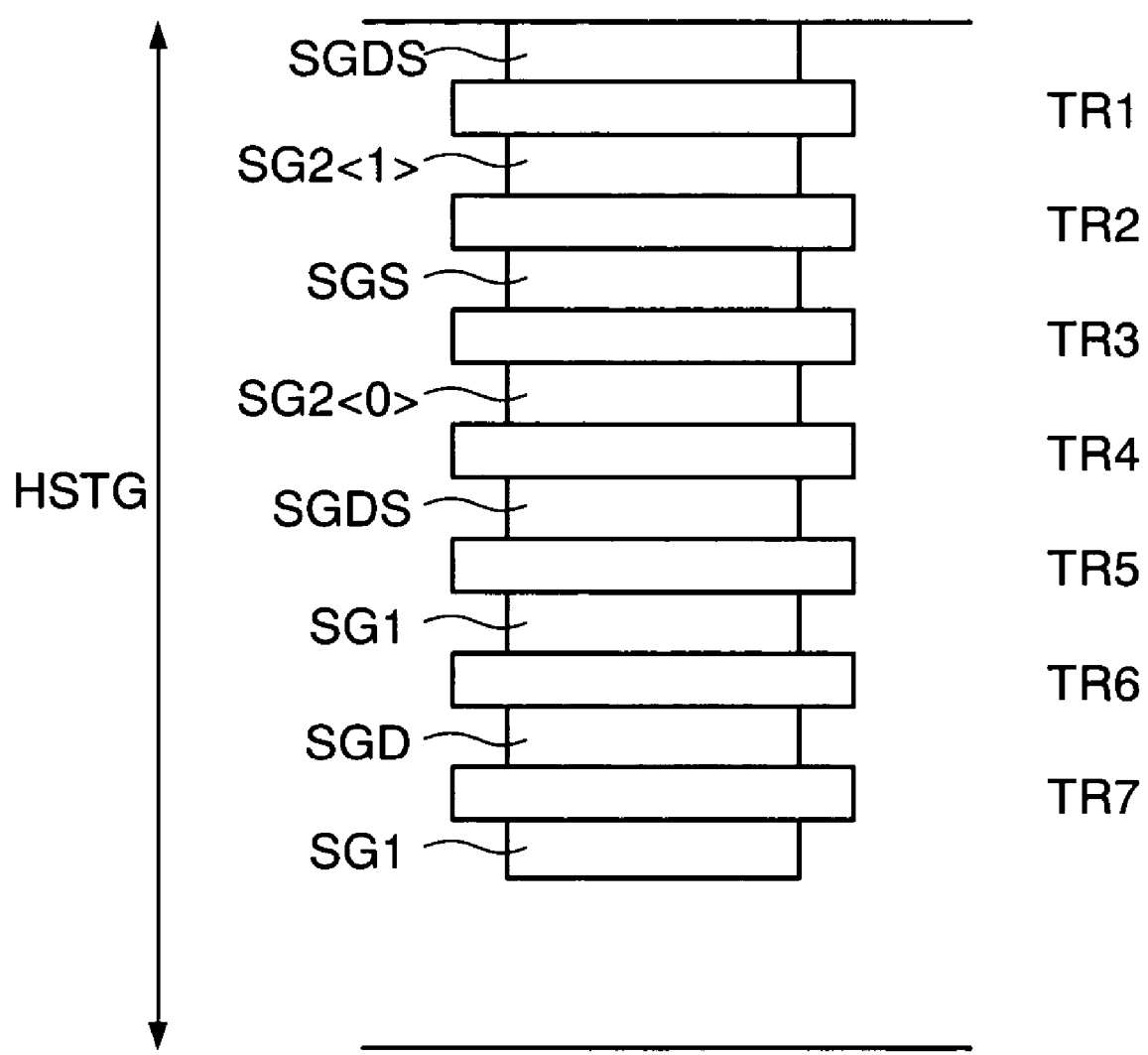
FIG. 17 is a diagram showing an example of the plane layout of the high withstand voltage transistors shown in FIG. 16.

As shown in FIG. 17, the peripheral circuit includes high withstand voltage transistors TR1 to TR7. The transistors TR1, TR4, and TR5 respectively correspond to the transistors TRS30, TRS20, and TRS10 in the aforementioned embodiments. Namely, it has hitherto been necessary to provide another transistor which is connected in series with the transistor TR5, but it is omitted in this embodiment.

The transistor TR1 transfers the non-select signal SGDS to the select gate line SG2<1>. The transistor TR2 transfers the select gate signal SGS to the select gate line SG2<1>. The transistor TR3 transfers the select gate signal SGS to the select gate line SG2<0>. The transistor TR4 transfers the non-select signal SGDS to the select gate line SG2<0>. The transistor TR5 transfers the non-select signal SGDS to the select gate line SG1. The transistor TR6 transfers the select gate signal SGD to the select gate line SG1. The transistor TR7 transfers the select gate signal SGD to the select gate line SG1.

FIG. 17 is a plane layout diagram showing an example in which the transistors TR1 to TR7 are arranged within a height HSTG of twice as long as NAND cell string STG. As shown in FIG. 17, the transistors TR1 to TR7 can form one transistor string by sharing their junctions (their diffusion areas).

More specifically, the transistor TR1 and the transistor TR2 share source/drain connected to the select gate line SG2<1>. The transistor TR2 and the transistor TR3 share source/drain to which the select gate signal SGS is supplied. The transistor TR3 and the transistor TR4 share source/drain connected to the select gate line SG2<0>. The transistor TR4 and the transistor TR5 share source/drain to which the non-select signal SGDS is supplied. The transistor TR5 and the transistor TR6 share source/drain connected to the select gate line SG1. The transistor TR6 and the transistor TR7 share source/drain to which the select gate signal SGD is supplied. Such an arrangement as shown in FIG. 17 can be adopted, for example, by up to the 130 nm generation.

Figure 18:
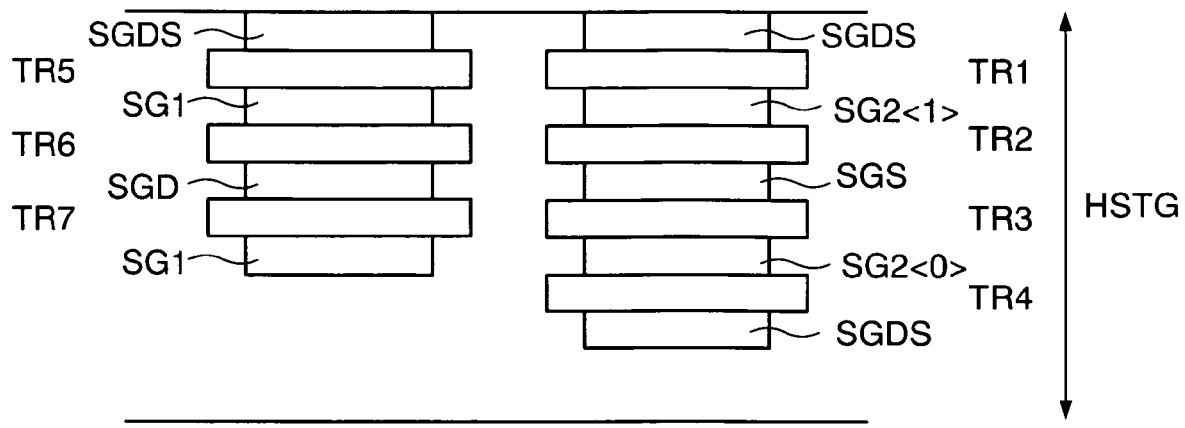
FIG. 18 is a diagram showing another example of the plane layout of the high withstand voltage transistors shown in FIG. 16.

In FIG. 18, the transistor string of the transistors TR1 to TR4 and the transistor string of the transistors TR5 to TR7 are formed within the height HSTG of twice as long as NAND cell string STG. Namely, the transistors TR1 to TR7 are formed by two longitudinal transistor strings. Such an arrangement as shown in FIG. 18 can be adopted, for example, by the 90 nm generation.

Figure 19:
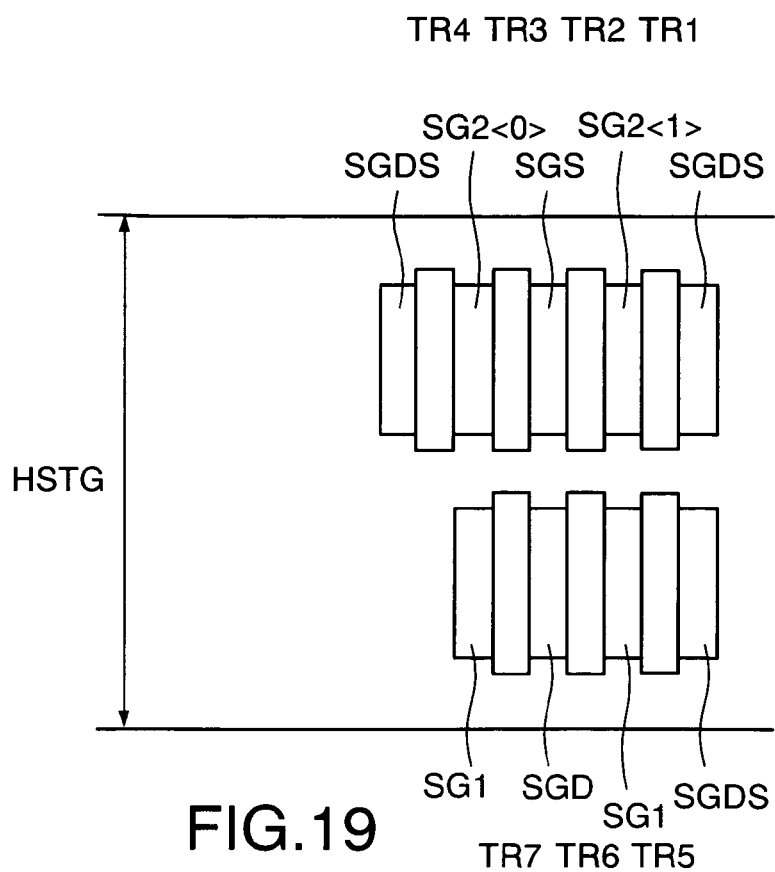
FIG. 19 is a diagram showing a still another example of the plane layout of the high withstand voltage transistors shown in FIG. 16.

In FIG. 19, a transistor string of the transistors TR1 to TR4 and a transistor string of the transistors TR5 to TR7 are formed in a lateral direction within the height HSTG of twice as long as NAND cell string STG. Namely, the transistors TR1 to TR7 are formed by two lateral transistor strings. Such an arrangement as shown in FIG. 19 can be adopted, for example, by the 70 nm generation.

Figure 20:
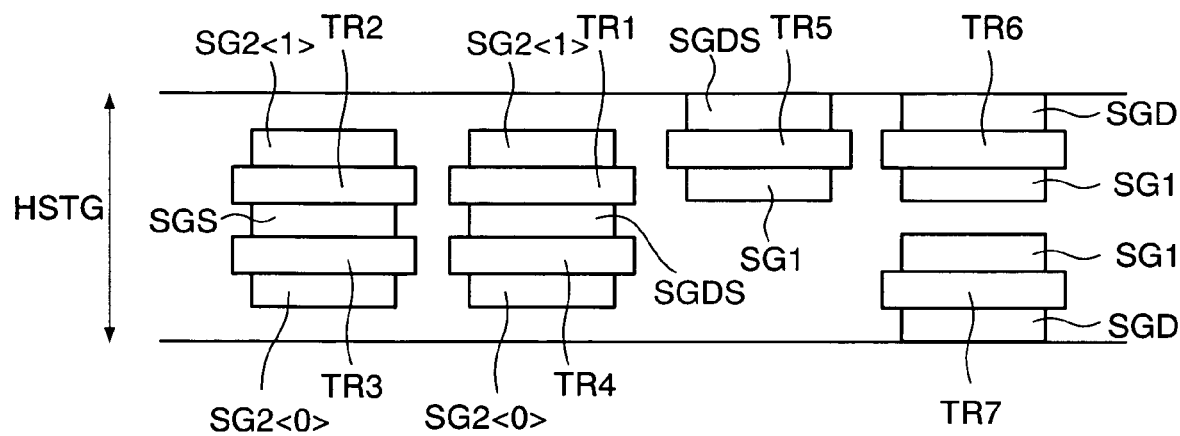
FIG. 20 is a diagram showing yet another example of the plane layout of the high withstand voltage transistors shown in FIG. 16.

In FIG. 20, a transistor string of the transistors TR1 and TR4 and a transistor string of the transistors TR2 and TR3 are formed in a longitudinal direction and the transistors TR5 to TR7 are arranged individually within the height HSTG of twice as long as NAND cell string STG. Such an arrangement as shown in FIG. 20 can be adopted, for example, by the 55 nm generation.

Figure 21:
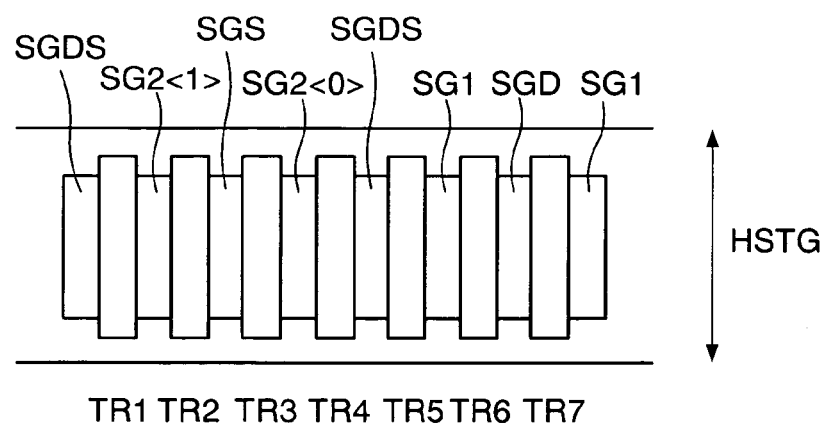
FIG. 21 is a diagram showing a further example of the plane layout of the high withstand voltage transistors shown in FIG. 16.

In FIG. 21, a transistor string of the transistors TR1 to TR7 are formed in a lateral direction within the height HSTG of twice as long as NAND cell string STG. Namely, the transistors TR1 to TR7 are formed by one lateral transistor string. Such an arrangement as shown in FIG. 21 can be adopted, for example, by a generation next to the 55 nm generation.

Figure 22:
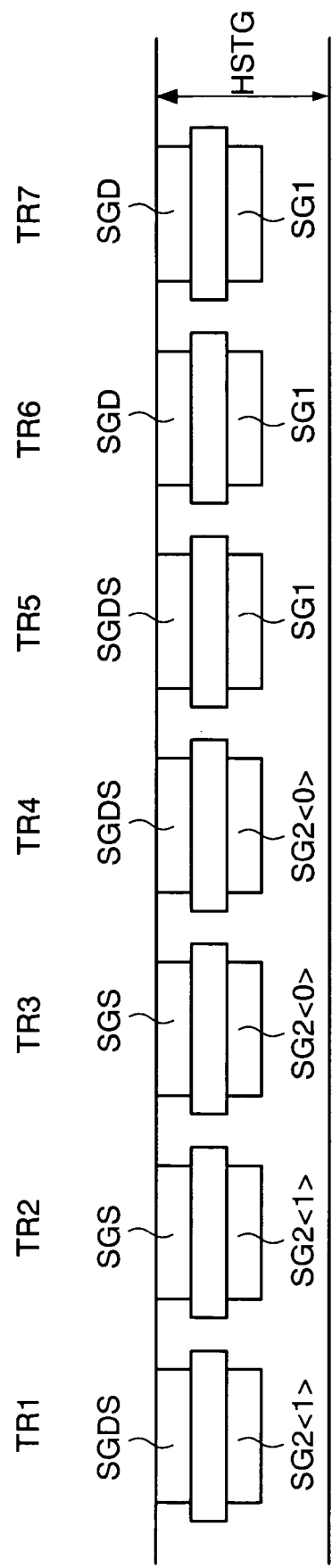
FIG. 22 is a diagram showing a still further example of the plane layout of the high withstand voltage transistors shown in FIG. 16.

In FIG. 22, the transistors TR1 to TR7 are formed individually in a lateral direction within the height HSTG of twice as long as NAND cell string STG. Namely, the transistors TR1 to TR7 are arranged individually so that a gate length direction of each of the transistors TR1 to TR7 is parallel with a direction of the height HSTG. Such an arrangement as shown in FIG. 22 can be adopted, for example, by a generation next but one to the 55 nm generation.

Figure 23:
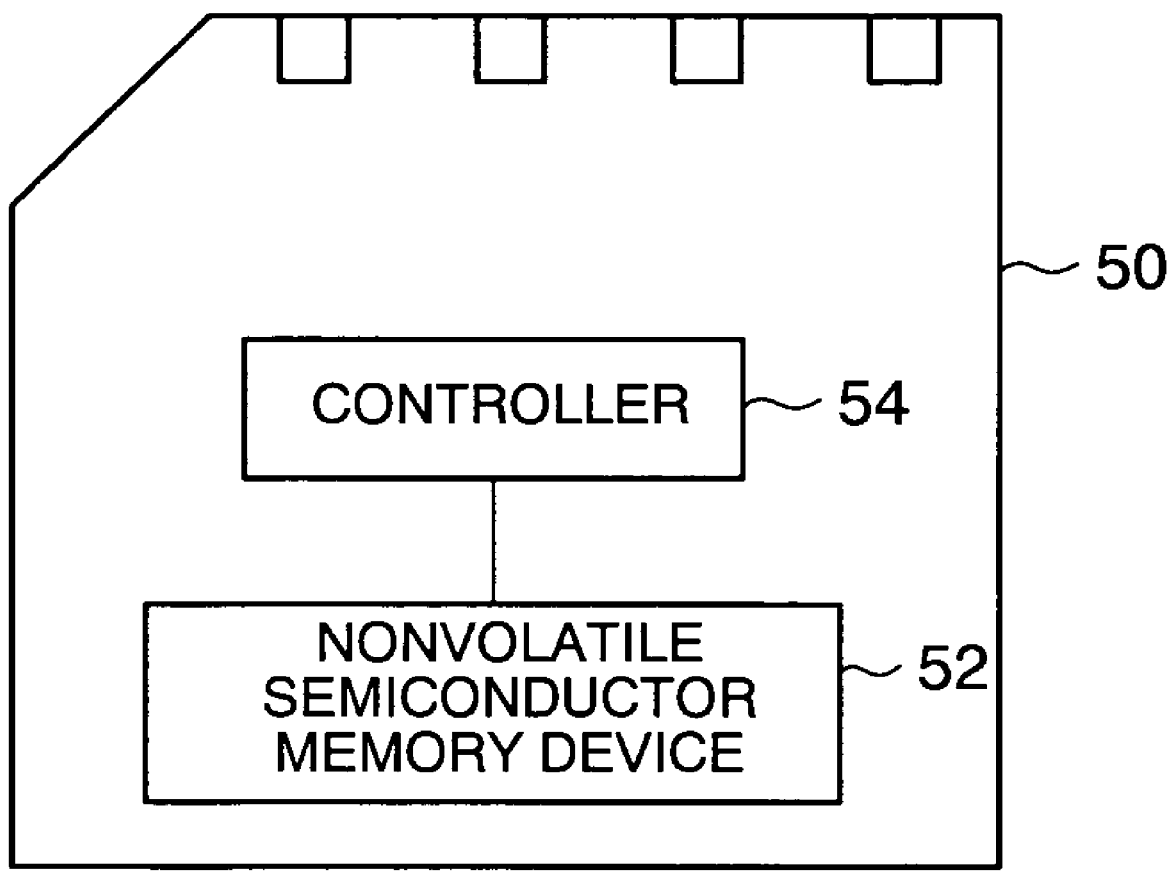
FIG. 23 is a diagram showing the configuration of a memory card equipped with the nonvolatile semiconductor memory device according to the first embodiment to the fourth embodiment.

It should be mentioned that the present invention is not limited to the aforementioned embodiments, and various changes may be made therein. For example, the nonvolatile semiconductor memory device according to the aforementioned first embodiment to fourth embodiment can be mounted in a memory card 50 as shown in FIG. 23. Namely, a nonvolatile semiconductor memory device 52 and a controller 54 which controls the nonvolatile semiconductor memory device 52 can be mounted to compose the memory card 50.

Moreover, the aforementioned embodiments are explained with the nonvolatile semiconductor memory device as an example, but the present invention is also applicable to other types of semiconductor memory devices including a memory cell array having plural select gate transistors to select one or plural memory cells from plural memory cells.

The invention claimed is:

1. A semiconductor memory device, comprising:
   a memory cell array including a plurality of memory blocks, each memory block including a plurality of memory cells arranged in a matrix and the memory cell array including a plurality of first select gate transistors to select one or more memory cells;
   a select gate line configured to input a control signal which controls continuity of the first select gate transistor to a gate of the first select gate transistor, the select gate line being shared between two adjacent memory blocks; and
   a row select circuit configured to select a memory block of a row designated by an input address signal, wherein the row select circuit comprises:
   only one transfer transistor provided between the select gate line and a non-select signal line to which a non-select signal is supplied, the non-select signal being the control signal indicating non-selection; and
   a select gate control circuit configured to bring the transfer transistor into conduction to supply the non-select signal to the select gate line when both the two adjacent memory blocks are not selected.

2. The semiconductor memory device according to claim 1, wherein the select gate control circuit is a NOR circuit to which two respective select signals of the adjacent memory blocks are input, an output of the NOR circuit being input to a gate of the transfer transistor.

3. The semiconductor memory device according to claim 1, wherein the select gate control circuit is an AND circuit to which inversion signals of two respective select signals of the adjacent memory blocks are input, an output of the AND circuit is input to a gate of the transfer transistor.

4. The semiconductor memory device according to claim 1, wherein
   the select gate control circuit comprises:
   a NAND circuit to which inversion signals of two respective select signals of the adjacent memory blocks are input; and
   an inverter to which an output of the NAND circuit is input, an output of the inverter being input to a gate of the transfer transistor.

5. The semiconductor memory device according to claim 1, wherein the select gate control circuit comprises a plurality of transistors.

6. The semiconductor memory device according to claim 5, wherein a film thickness of a gate insulating film of the transfer transistor is thicker than that of each of the transistors in the select gate control circuit.

7. The semiconductor memory device according to claim 5, wherein a withstand voltage of the transfer transistor is higher than that of each of the transistors in the select gate control circuit.

8. The semiconductor memory device according to claim 1, wherein the memory cell in the memory cell array is an electrically rewritable nonvolatile memory cell.

9. The semiconductor memory device according to claim 1, further comprising a second select gate transistor provided on an opposite side to the first select gate transistor with the memory cell therebetween.

10. The semiconductor memory device according to claim 9, wherein a plurality of memory cells connected in series are provided between the first select gate transistor and the second select gate transistor.

11. The semiconductor memory device according to claim 9, wherein one memory cell is provided between the first select gate transistor and the second select gate transistor.

12. A memory card including a semiconductor memory device, wherein the semiconductor memory device comprises:
   a memory cell array including a plurality of memory blocks, each memory block including a plurality of memory cells arranged in a matrix and the memory cell array including a plurality of first select gate transistors to select one or more memory cells;
   a select gate line configured to input a control signal which controls continuity of the first select gate transistor to a gate of the first select gate transistor, the select gate line being shared between two adjacent memory blocks; and
   a row select circuit configured to select a memory block of a row designated by an input address signal, and the row select circuit comprises:
   only one transfer transistor provided between the select gate line and a non-select signal line to which a non-select signal is supplied, the non-select signal being the control signal indicating non-selection; and
   a select gate control circuit configured to bring the transfer transistor into conduction to supply the non-select signal to the select gate line when both the two adjacent memory blocks are not selected.

* * * * *